(12) United States Patent
Lu et al.

(10) Patent No.: US 10,600,569 B2
(45) Date of Patent: Mar. 24, 2020

(54) FINGER METAL-ON-METAL CAPACITOR CONTAINING NEGATIVE CAPACITANCE MATERIAL

(71) Applicant: QUALCOMM Incorporated, San Diego, CA (US)

(72) Inventors: Ye Lu, San Diego, CA (US); Haitao Cheng, San Diego, CA (US); Chao Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/961,594

(22) Filed: Apr. 24, 2018

(65) Prior Publication Data

US 2019/0326057 A1 Oct. 24, 2019

(51) Int. Cl.
*H01L 23/52* (2006.01)
*H01G 4/10* (2006.01)
*H01L 23/522* (2006.01)
*H01G 4/01* (2006.01)

(52) U.S. Cl.
CPC ............... *H01G 4/10* (2013.01); *H01G 4/01* (2013.01); *H01L 23/5223* (2013.01); *H01L 2924/3011* (2013.01)

(58) Field of Classification Search
CPC ........ H01G 4/10; H01G 4/01; H01L 23/5223; H01L 2924/3011
USPC .......................................... 257/532; 438/957
See application file for complete search history.

(56) References Cited

U.S. PATENT DOCUMENTS

2008/0135901 A1* 6/2008 Shimojo ........... H01L 21/76816
257/295
2015/0318285 A1* 11/2015 Zhang ............... H01L 27/10844
257/295

* cited by examiner

*Primary Examiner* — Didarul A Mazumder
(74) *Attorney, Agent, or Firm* — Holland & Hart LLP/Qualcomm (57) ABSTRACT

Methods, systems, and devices for a finger metal-on-metal (FMOM) capacitor including a negative capacitance material are described. In one examples, a FMOM capacitor may include a first electrode and a second electrode. The FMOM capacitor may include a dielectric layer coating a first sidewall of the first electrode and a second sidewall of a second electrode. A portion of the first sidewall may be substantially parallel to a portion of the second sidewall. The FMOM capacitor may also include a negative capacitance material disposed in a channel between the first sidewall of the first electrode and the second sidewall of the second electrode. The negative capacitance material may extend in a direction that is substantially parallel to the portion of the first sidewall and the portion of the second sidewall.

14 Claims, 8 Drawing Sheets

FINGER METAL-ON-METAL CAPACITOR CONTAINING NEGATIVE CAPACITANCE MATERIAL

BACKGROUND

The following relates generally to a finger metal-on-metal (FMOM), and more specifically to an FMOM capacitor containing negative capacitance material.

Memory devices are widely used to store information in various electronic devices such as computers, wireless communication devices, cameras, digital displays, and the like. Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Each memory cell of a memory device may use at least one capacitor to store information. Some examples of memory devices use FMOM capacitors to store information. It may be desirable to improve capacitance density per unit area for an FMOM capacitor to increase an amount of information the can be stored. Improved reliability without reducing capacitance density per unit area may also be desirable.

SUMMARY

The described techniques relate to improved methods, systems, devices, or apparatuses that support a finger metal-on-metal (FMOM) capacitor containing negative capacitance material. Specifically, the described techniques herein may support maximizing a capacitance density of an FMOM capacitor in an integrated circuit, while preserving a same circuit footprint. Thereby, the described techniques herein address the deficiencies of existing fabrication techniques such as lithography and etching, which are unable to increase the capacitance density due to resolution limitations.

An FMOM capacitor containing negative capacitance material is described the FMOM capacitor may include a first electrode and a second electrode, a dielectric layer coating a first sidewall of the first electrode and a second sidewall of a second electrode, where a portion of the first sidewall is substantially parallel to a portion of the second sidewall, and a negative capacitance material disposed in a channel between the first sidewall of the first electrode and the second sidewall of the second electrode, where the negative capacitance material extends in a direction that is substantially parallel to the portion of the first sidewall and the portion of the second sidewall.

In some examples of the FMOM capacitor described herein, the negative capacitance material, the first electrode, and the second electrode are coplanar. In some examples of the FMOM capacitor described herein, the negative capacitance material disposed in the channel is positioned within a footprint of the FMOM capacitor. In some examples of the FMOM capacitor described herein, the negative capacitance material is at least partially overlapping with the first electrode or the second electrode, or both in at least one dimension.

In some examples of the FMOM capacitor described herein, the first electrode and the second electrode are a positive electrode or a negative electrode. In some examples of the FMOM capacitor described herein, the negative capacitance material comprises a material chosen from the group consisting of $Pb(Zr_{0.2}Ti_{0.8})O_3$, $Hf_{0.42}Zr_{0.58}O_2$, and $Al_{0.83}In_{0.17}N$.

In some examples of the FMOM capacitor described herein, a width of the channel is inversely proportional to a width of the dielectric layer formed on sidewalls of the first electrode and the second electrode. In some examples of the FMOM capacitor described herein, a length of the channel is proportional to a length of the first electrode and the second electrode, or a length of the dielectric layer formed on sidewalls of the first electrode or the second electrode, or a combination thereof.

A method for fabricating an FMOM capacitor is described. The method may include depositing a layer of electrode material over a substrate to form a first electrode and a second electrode, and at least one spacer extending in a lateral direction along a sidewall of each electrode, the at least one spacer defining a channel between the first electrode and the second electrode, depositing a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall, performing a dry anisotropic etch to the layer of dielectric material deposited on the upper surface of each electrode and within the channel, and depositing a layer of negative capacitance material within the channel, where the layer of negative capacitance material extends in a direction that is substantially parallel to the portion of the first sidewall and the portion of the second sidewall.

An apparatus that supports fabricating an FMOM capacitor is described. The apparatus may include means for depositing a layer of electrode material over a substrate to form a first electrode and a second electrode, and at least one spacer extending in a lateral direction along a sidewall of each electrode, the at least one spacer defining a channel between the first electrode and the second electrode, means for depositing a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall, means for performing a dry anisotropic etch to the layer of dielectric material deposited on the upper surface of each electrode and within the channel, and means for depositing a layer of negative capacitance material within the channel, where the layer of negative capacitance material extends in a direction that is substantially parallel to the portion of the first sidewall and the portion of the second sidewall.

Another apparatus that supports fabricating an FMOM capacitor is described. The apparatus may include a processor, memory in electronic communication with the processor, and instructions stored in the memory. The instructions may be executable by the processor to cause the apparatus to deposit a layer of electrode material over a substrate to form a first electrode and a second electrode, and at least one spacer extending in a lateral direction along a sidewall of each electrode, the at least one spacer defining a channel between the first electrode and the second electrode, deposit a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall, perform a dry anisotropic etch to the layer of dielectric material deposited on the upper surface of each electrode and within the channel, and deposit a layer of negative capacitance material within the channel, where the layer of negative capacitance material extends in a direction that is substantially parallel to the portion of the first sidewall and the portion of the second sidewall.

A non-transitory computer-readable medium storing code that supports PDAF power optimization at a device is described. The code may include instructions executable by a processor to deposit a layer of electrode material over a substrate to form a first electrode and a second electrode, and at least one spacer extending in a lateral direction along a sidewall of each electrode, the at least one spacer defining a channel between the first electrode and the second electrode, deposit a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall, perform a dry anisotropic etch to the layer of dielectric material deposited on the upper surface of each electrode and within the channel, and deposit a layer of negative capacitance material within the channel, where the layer of negative capacitance material extends in a direction that is substantially parallel to the portion of the first sidewall and the portion of the second sidewall.

Some examples of the method, apparatus, and non-transitory computer-readable medium described herein may further include operations, features, means, or instructions for performing a chemical-mechanical planarization (CMP) process after depositing the layer of negative capacitance material within the channel.

In some examples of the method, apparatus, and non-transitory computer-readable medium described herein, the layer of negative capacitance material, the first electrode, and the second electrode are coplanar.

In some examples of the method, apparatus, and non-transitory computer-readable medium described herein, the layer of negative capacitance material comprises a material chosen from the group consisting of $Pb(Zr_{0.2}Ti_{0.8})O_3$, $Hf_{0.42}Zr_{0.58}O_2$, and $Al_{0.83}In_{0.17}N$.

In some examples of the method, apparatus, and non-transitory computer-readable medium described herein, a width of the channel is inversely proportional to a width of the layer of dielectric material deposited on the first sidewall of the first electrode and the second sidewall of a second electrode.

In some examples of the method, apparatus, and non-transitory computer-readable medium described herein, a length of the channel is proportional to a length of the first electrode and the second electrode, or a length of the layer of dielectric material deposited on the first sidewall of the first electrode and the second sidewall of a second electrode, or a combination thereof.

An integrated circuit is described. The integrated circuit may include a first layer comprising a plurality of electrodes, a dielectric layer formed on sidewalls of the plurality of electrodes of the first layer, a negative capacitance material deposited in a channel between at least one set of electrodes of the first layer, the channel extending between a sidewall of a first electrode and a sidewall of a second electrode of the at least one set of electrodes, a second dielectric layer formed across an upper surface of the plurality of electrodes, an upper surface of the dielectric layer, and an upper surface of the negative capacitance material, a second layer comprising a plurality of electrodes formed on the second dielectric layer, a third dielectric layer formed on sidewalls of the plurality of electrodes of the second layer, and a second negative capacitance material deposited in a channel between at least one set of electrodes of the second layer, the channel extending between a sidewall of a first electrode and a sidewall of a second electrode of the at least one set of electrodes of the second layer.

In some examples of the integrated circuit, the sidewall of the first electrode and the sidewall of the second electrode associated with the first layer have the dielectric layer formed thereon. In some examples of the integrated circuit, the sidewall of the first electrode and the sidewall of the second electrode associated with the second layer have the third dielectric layer formed thereon.

In some examples of the integrated circuit, the negative capacitance material or the second negative capacitance material, or both comprises a material chosen from the group consisting of $Pb(Zr_{0.2}Ti_{0.8})O_3$, $Hf_{0.42}Zr_{0.58}O_2$, and $Al_{0.83}In_{0.17}N$.

In some examples of the integrated circuit, the first layer is in electronic communication with the second layer through at least one interconnect.

In some examples of the integrated circuit, the first electrode of the first layer, and the second electrode of the first layer, and the negative capacitance material deposited in the channel between the at least one set of electrodes of the first layer, are coplanar.

In some examples of the integrated circuit, the first electrode of the second layer, and the second electrode of the second layer, and the second negative capacitance material deposited in the channel between the at least one set of electrodes of the second layer, are coplanar.

DETAILED DESCRIPTION

A finger metal-on-metal (FMOM) integrated circuit may include a number of electrodes (e.g., both positive and negative) spaced across a substrate with an interlayer dielectric material positioned between the electrodes. A dominant capacitance of the FMOM integrated circuit may include an interlayer capacitor between neighboring electrodes. A negative capacitance material may be inserted between an intralayer dielectric material to increase a capacitance density of the FMOM integrated circuit. By inserting the negative capacitance material into the intralayer dielectric, current dielectric constant restrictions related to conventional dielectric material may be overcome.

Aspects of the disclosure are initially described in the context of a system for a camera device. Aspects of the disclosure are further illustrated by and described with reference to apparatus diagrams, system diagrams, and flowcharts that relate to an FMOM capacitor containing a negative capacitance material.

Figure 1:
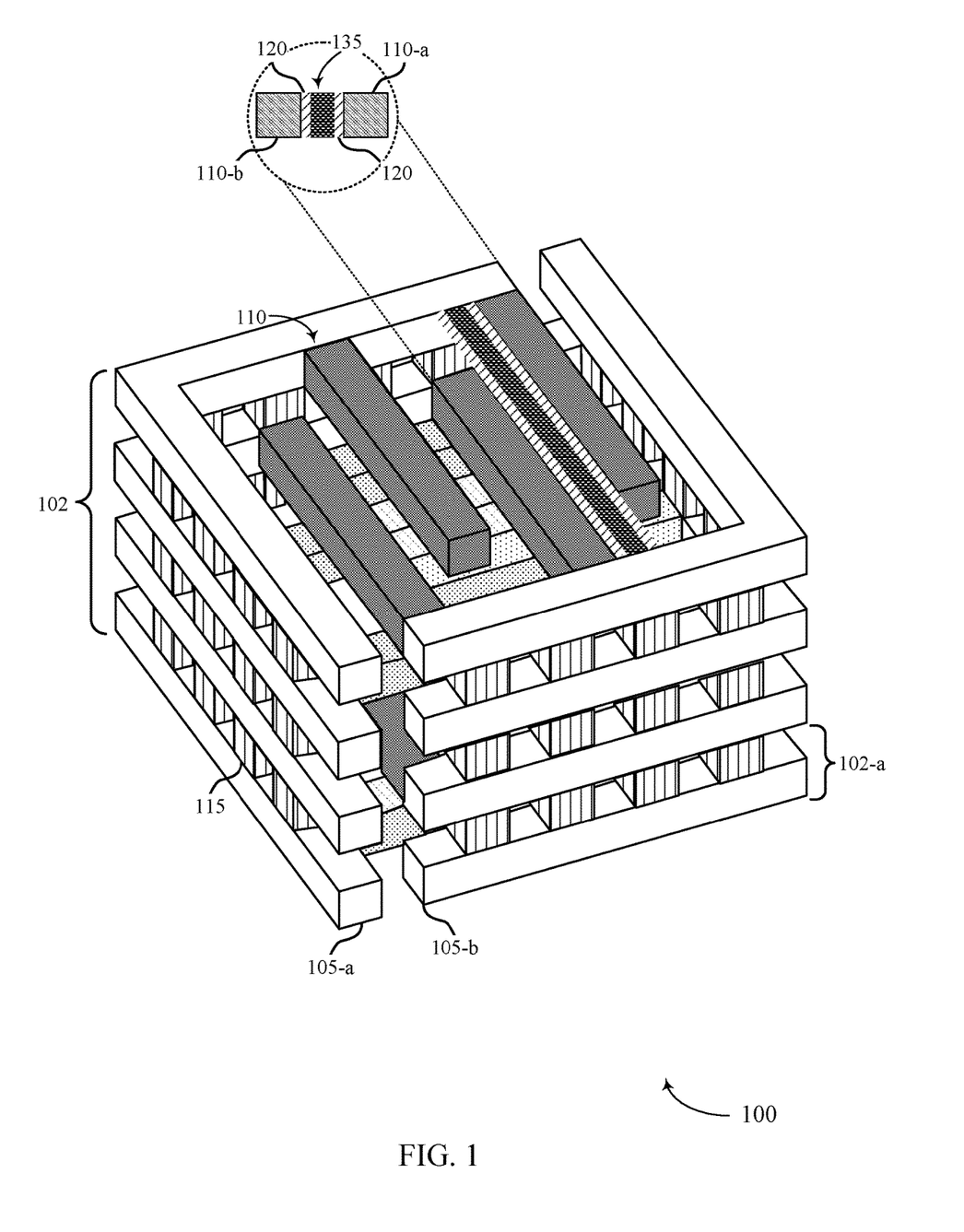
FIG. 1 illustrates an example of an FMOM capacitor array in accordance with aspects of the present disclosure.

FIG. 1 illustrates an example of an FMOM capacitor array 100 in accordance with aspects of the present disclosure. In particular, FIG. 1 may illustrate a cross-sectional side and top-down view of the FMOM capacitor array 100, which may have various features. For example, the FMOM capacitor array 100 may include a plurality FMOM layers 102, which may be formed of conductive material and may be an electrode in some embodiments. Examples of conductive materials includes metals, for example, tungsten and metal silicides. The number of FMOM layers 102 illustrated in FIG. 1 is merely exemplary and there may be additional FMOM layers arranged in a different manner. The FMOM layers 102 may extend in a vertical direction.

In some examples, a single FMOM layer may be formed from two electrodes 105 having same or different characteristics. For example, a first FMOM layer 102-$a$ may include a first electrode 105-$a$ formed of a first conductive material functioning as a positive electrode, and a second electrode 105-$b$ formed of a second conductive element functioning as a negative electrode. Examples of positive electrode materials include $LiCoO_2$, $LiNi_{0.8}Co_{0.15}Al_{0.05}O_2$, $LiNi_{1/3}Mn_{1/3}Co_{1/3}O_2$, and $LiFePO_4$. Examples of negative electrode materials include graphite and $Li_4Ti_5O_{12}$.

Additionally, each electrode 105 of an FMOM layer 102 may include two groups of electrode fingers 110 to form a single layer FMOM capacitor. For example, the first electrode 105-$a$ and the second electrode 105-$b$ may each have two electrode fingers. The term "electrode finger" may refer to the rectilinear element of an electrode that is interdigitated with other similar rectilinear elements. As such, the FMOM capacitor array 100 may have an interdigitated structure with electrode fingers interdigitated. An electrode finger 110 may also be referred to simply as an electrode that may be part of or separate from an electrode 105.

The plurality of FMOM layers 102 may also be stacked and coupled to one another via interconnects 115. The term "interconnect" may be used herein to describe an element, component, layer that serves as a local interconnect for interfacing or an interface to form connections between a lower FMOM layer and an upper FMOM layer. Examples of interconnect materials includes metals, for example, tungsten and metal silicides. In the example structure of FIG. 1, there may be four FMOM layers 102 that are vertically stacked relative to one another. These FMOM layers 102 may be directly disposed over one another so that the interconnects 115 are aligned. As a result, two corresponding electrodes 105 located in two neighboring FMOM layers 102 may be electrically connected together. In accordance with the characteristics of capacitors, the electrical equivalent circuit of the FMOM capacitor array 100 may be equal to a plurality of single layer FMOM capacitors connected in parallel.

In some examples, each FMOM layer 102 may have a dielectric layer, which may include dielectric material 120 formed on sidewalls of an electrode finger 110 corresponding to an electrode 105 of an FMOM layer. For example, dielectric material 120 may be formed on sidewalls of a first electrode finger 110-$a$ and sidewalls of a second electrode finger 110-$b$. Examples of dielectric materials include oxides or nitrides, for example, silicon oxide or silicon nitride. In some examples, a negative capacitance material 135 may be deposited in a channel between at least one set of electrode fingers 110. Examples of the negative capacitance material includes $Pb(Zr_{0.2}Ti_{0.8})O_3$, $Hf_{0.42}Zr_{0.58}O_2$, and $Al_{0.83}In_{0.17}N$. The channel may extend, for example, between a sidewall of the first electrode finger 110-$a$ and a sidewall of the second electrode finger 110-$b$. The negative capacitance material 135 deposited in the channel, the at least one set of electrode fingers 110, and the dielectric material 120 formed on sidewalls of the at least one set of electrode fingers 110 may be coplanar (i.e., in a same plane). In some embodiments, the negative capacitance material 135 may be at least partially overlapping with one or more electrodes 105 in at least one dimension (e.g., vertical or horizontal direction). For example, a negative capacitance material of an upper FMOM layer 102 may overlap an electrode 105 of a lower FMOM layer 102.

By inserting negative capacitance material into the channel (i.e., the FMOM intralayer dielectric), the FMOM capacitor array 100 may overcome the dielectric constant restriction of conventional dielectric material. As a result, it may also increase the capacitance density of the FMOM capacitor array 100 without increasing a device footprint. A footprint may be a physical dimension within a device that the FMOM capacitor array 100 occupies. In other words, the FMOM capacitor array 100 may increase the capacitance density without adding to the physical dimensions of a device.

Figure 2:
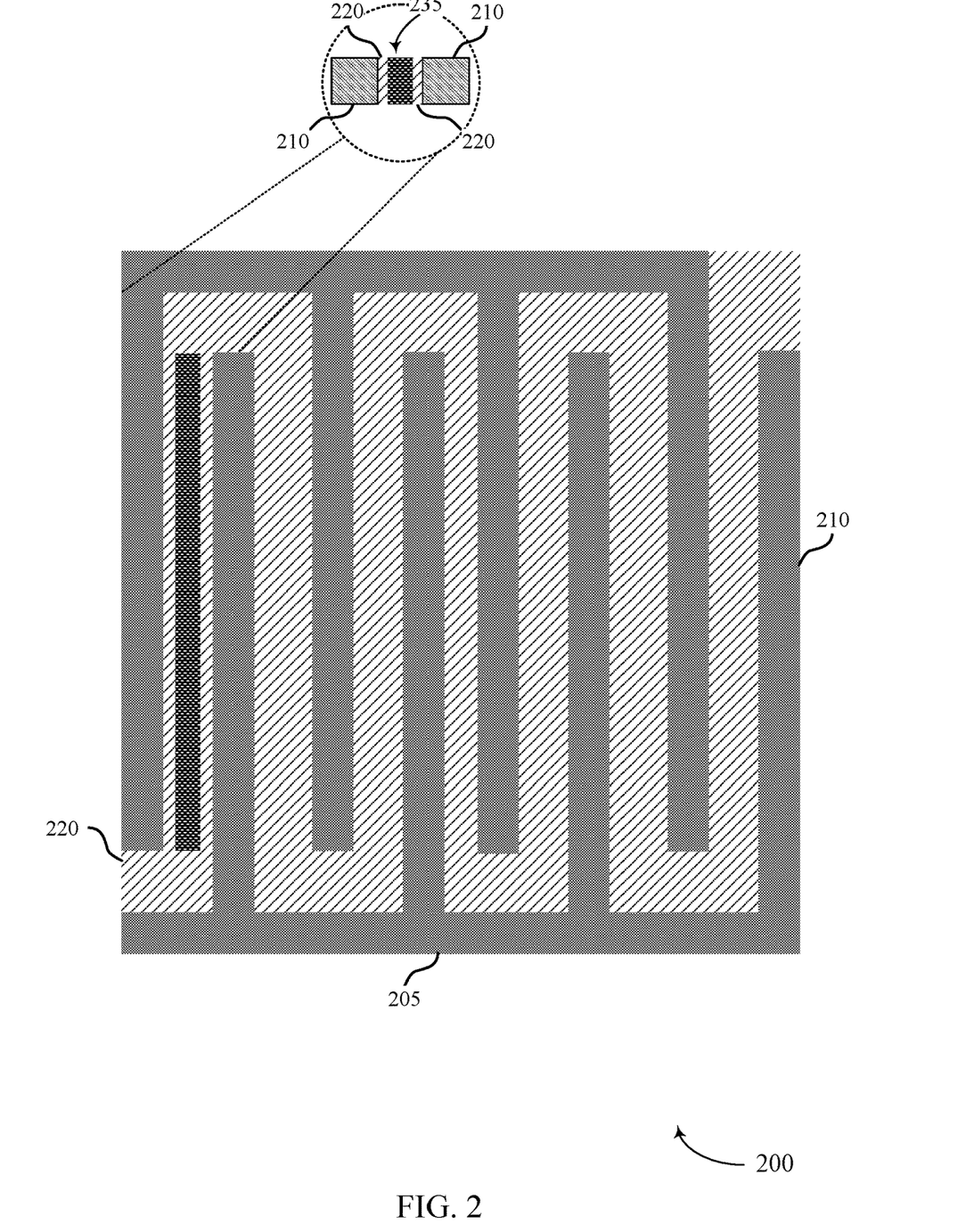
FIG. 2 illustrates an example of a top down view of at least one layer of an FMOM capacitor in accordance with aspects of the present disclosure.

FIG. 2 illustrates an example of a top down view of at least one layer of an FMOM capacitor 200 in accordance with aspects of the present disclosure. The FMOM capacitor 200 may be a passive device in current circuitry and integrated circuit chips. In some examples, the FMOM capacitor 200 may implement aspects of the FMOM capacitor array 100 as described with reference to FIG. 1.

The FMOM capacitor 200 may include electrodes 205 and a plurality of electrode fingers 210 extending from the electrodes 205. The electrodes 205 may extend in a first direction of a plane (x-y plane), and each of the electrode fingers 210 may extend in a second direction in the plane that may be different than the first direction. For example, the electrodes 205 may extend in an x-direction, while the electrode fingers 210 may extend in a y-direction. The electrodes 205 and each of the electrode fingers 210 may be coplanar, while extending in different directions.

The number of electrode fingers 210 illustrated in FIG. 2 is merely exemplary and there may be additional electrode fingers arranged in a different manner. The electrode fingers 210 may establish a capacitance for the FMOM capacitor 200. In some embodiments, the capacitance may be based on a spacing between each of the electrode fingers 210. That is, the spacing between two adjacent electrode fingers 210 may establish the capacitance between the two electrode fingers 210. In some embodiments, the spacing between electrode fingers of an FMOM layer may be same or different between all the electrode fingers of an FMOM layer.

The electrodes 205 and the electrode fingers 210 may be electrically insulated from one another by a dielectric layer 220. In some embodiments, it may be desirable to maximize a capacitance density of the FMOM capacitor 200 while preserving a same footprint. In some examples of FMOM capacitors, a dominant capacitance of the FMOM capacitor may be an interlayer capacitance G. The interlayer capacitance $C_i$ is a capacitance between two adjacent electrode fingers in a same FMOM layer. In some examples, there may be a capacitance between adjacent FMOM layers from overlapping electrode fingers that may be referred to as an overlap capacitance. In some examples, a capacitance of the FMOM capacitor 200 may be based on an amount of electrode fingers 210 in a single FMOM layer. For example, more electrode fingers 210 may results in a greater capacitance for the FMOM capacitor 200. Further, the length of the electrode fingers 210 can also increase capacitance, however more electrode fingers and longer electrode fingers require extra space, which may be an ineffective approach for increasing capacitance density because the footprint of a device (e.g., including an FMOM capacitor) may need to be increased. Therefore, there may be a desire and need for an alternative approach to increase the capacitance density of an FMOM capacitor.

To increase the capacitance density of an FMOM capacitor, a negative capacitance material may be formed within a channel (i.e., an FMOM intralayer dielectric) between at least one set of electrode fingers 210. For example, the FMOM capacitor 200 may have a dielectric layer 220 formed on sidewalls of an electrode finger 210 corresponding to an electrode 205 of an FMOM layer. The dielectric layer 220 may be formed on sidewalls of a first electrode finger 210 and sidewalls of a second electrode finger 210. A negative capacitance material 235 may be deposited in a channel between at least one set of electrode fingers 210. The channel may extend, for example, between a sidewall of the first electrode finger 210 and a sidewall of the second electrode finger 210. The negative capacitance material 235 deposited in the channel, the at least one set of electrode fingers 210, and the dielectric layer 220 formed on sidewalls of the at least one set of electrode fingers 210 may be coplanar (i.e., in a same plane).

Figure 3A:
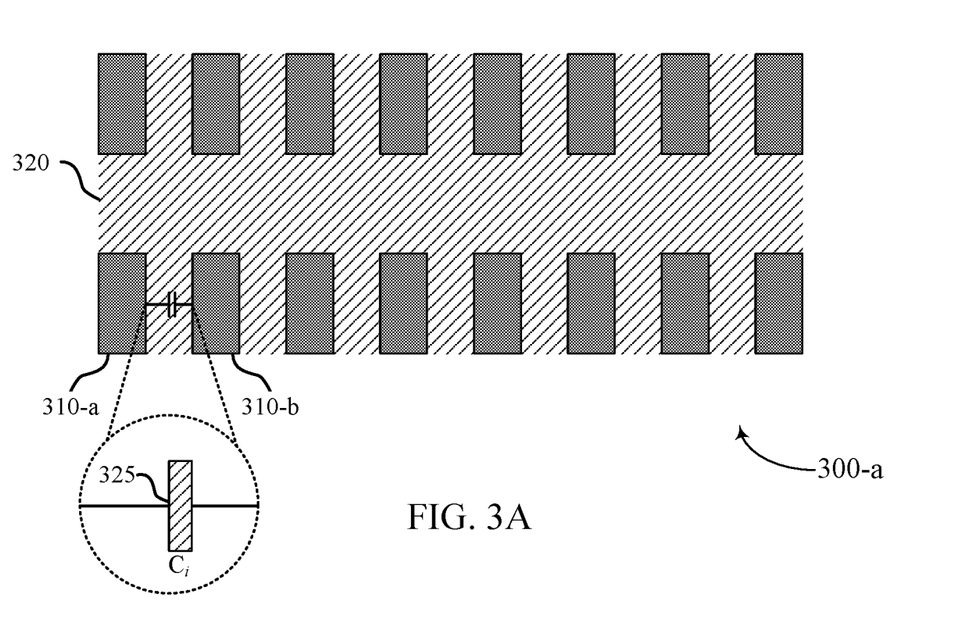
FIGS. 3A and 3B illustrate examples of a cross-section view of an FMOM capacitor containing negative capacitance material in accordance with aspects of the present disclosure.
Figure 3B:
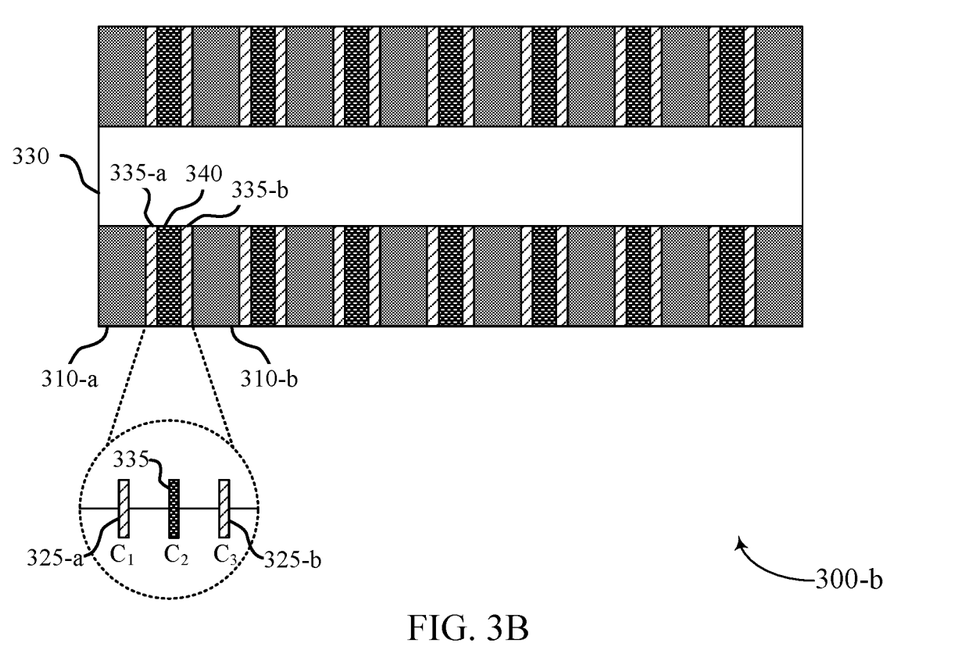

FIGS. 3A and 3B illustrate examples of a cross-section view of an FMOM capacitor 300 containing negative capacitance material in accordance with aspects of the present disclosure. In some examples, the FMOM capacitor 300 may implement aspects of the FMOM capacitor as described with reference to FIGS. 1 and 2.

Referring to a cross-section view of FMOM capacitor 300-a of FIG. 3A, the FMOM capacitor 300-a may have various features, for example, including a plurality of electrode fingers 310 and a dielectric layer 320 formed therearound. The electrode fingers 310 may be electrically insulated from one another by the dielectric layer 320. The dielectric layer 320 formed between electrode fingers 310 may provide an interlayer capacitance $C_i$. For example, an interlayer capacitance $C_i$ 325 may exist between electrode fingers, such as a first electrode finger 310-a and a second electrode finger 310-b.

The interlayer capacitance $C_i$ 325 may be defined according to the following equation:

$$C = \varepsilon \times \frac{A}{S} \qquad (1)$$

where $\varepsilon$ is the dielectric constant of the interlayer dielectric (e.g., the dielectric layer 320-a), A is the cross section of the electrode fingers 310, and S is the spacing between electrode fingers 310. The spacing S between electrode fingers may already be at a minimum spacing allowed by existing lithography resolution. As such, it may be incapable of further reducing the spacing S to increase the capacitance density. The described techniques herein support a self-aligned process to create an improved FMOM capacitor structure containing a negative capacitance material, which may increase the capacitance density without increasing a footprint of the FMOM capacitor or having to further reduce the spacing S.

Referring to a cross-section view of FMOM capacitor 300-b of FIG. 3B, the FMOM capacitor 300-b may have an increased capacitance density compared to existing FMOM capacitors, without increasing a footprint of the FMOM capacitor 300-b. The FMOM capacitor 300-b may have various features, for example, including a plurality of electrode fingers 310 formed on a substrate 330, a dielectric layer 335 formed on sidewalls of the electrode fingers 310, and a negative capacitance material 340 formed within a channel defined between sidewalls of a set of electrode fingers 310. The dielectric layer 335 (e.g., dielectric layer 335-a and 335-b) formed between electrode fingers 310 (e.g., electrode fingers 310-a and 310-b), and the negative capacitance material 340 formed within a channel defined between sidewalls of the dielectric layer 335 may provide a new interlayer capacitance $C_{new}$.

The new interlayer capacitance $C_{new}$ may be defined according to the following equation:

$$C_{new} = \frac{C_1 \times C_2 \times C_3}{C_2 \times C_3 + C_2 \times C_1 - C_1 \times C_3} \qquad (2)$$

where $C_1$, $C_2$, and $C_3$ are the resultant capacitances 325-a, 335, and 325-b corresponding to the dielectric layers 335 and the negative capacitance material 340. In some embodiments, the capacitance $C_1$ may be equal to $C_3$, after a fabrication process of the FMOM capacitor 300-b as described herein. The new interlayer capacitance $C_{new}$ may be further simplified and defined according to the following equation:

$$C_{new} = \frac{C_1 \times C_1 \times C_2}{2 \times C_2 \times C_1 - C_1 \times C_1} \qquad (3)$$

Using equations (1)-(3), the capacitance density ratio between the FMOM capacitor 300-a and the FMOM capacitor 300-b (i.e., the improved FMOM capacitor) may defined according to the following equation:

$$\frac{C_{new}}{C_i} = \frac{S_1 \times \varepsilon_2}{2 \times S_1 \times \varepsilon_2 - S_2 \times \varepsilon_1} \qquad (4)$$

wherein $S_1$ and $S_2$ are the thickness of the dielectric layer 335 and the negative capacitance material 340, and $\varepsilon_1$ and $\varepsilon_2$ are the absolute value of the dielectric constant of the dielectric layers 335 and the negative capacitance material 340. Assuming that $\varepsilon_1$ equals $\varepsilon_2$, equation (4) may be further simplified to the following equation:

$$\frac{C_{new}}{C_i} = \frac{S_1}{2S_1 - S_2} \qquad (5)$$

Equation (5) shows that the new interlayer capacitance $C_{new}$ contrasted with the interlayer capacitance $C_i$ ratio can be controlled by the thickness of the dielectric layer 335 and the negative capacitance material 340, which can be controlled by the methods described herein. For instance, if $S_1$ can be controlled to equal $0.51S_2$, then $C_{new}$ may be equal to $25C_i$. That is, the capacitance density of the FMOM capacitor 300-b may be increased by 25×.

Figure 4A:
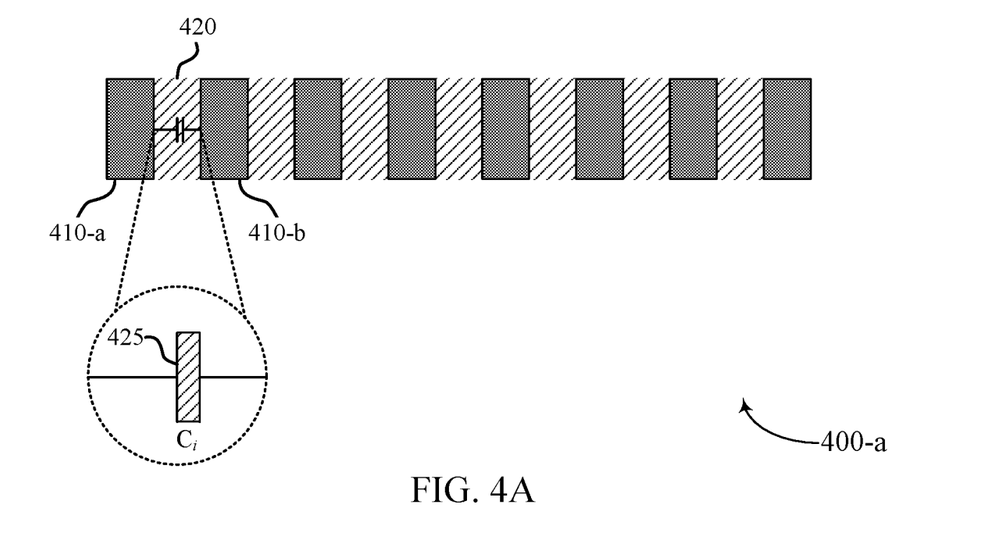
FIGS. 4A and 4B illustrate examples of a cross-section view of an FMOM capacitor containing negative capacitance material in accordance with aspects of the present disclosure.
Figure 4B:
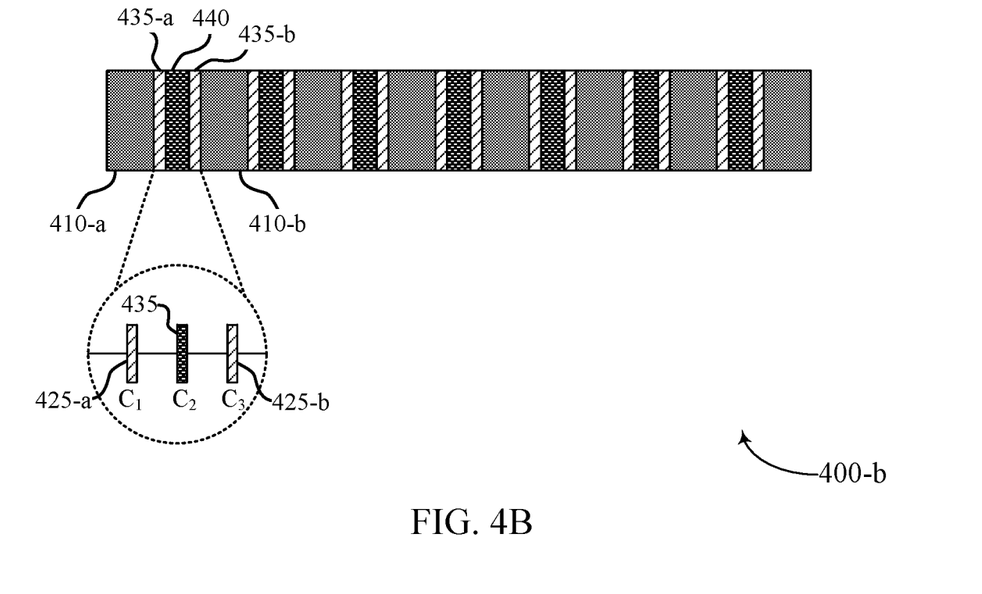

FIGS. 4A and 4B illustrate examples of a cross-section view of an FMOM capacitor 400 containing negative capacitance material in accordance with aspects of the present disclosure. In some examples, the FMOM capacitor 400 may implement aspects the FMOM capacitor structures as described with reference to FIGS. 3A and 3B.

Referring to a cross-section view of FMOM capacitor 400-a of FIG. 4A, the capacitor 400-a may have various features including a plurality of electrode fingers 410 and a dielectric layer 420 formed between the electrode fingers 410. For example, a dielectric layer 420 may be formed between a first electrode finger 410-a and a second electrode finger 410-b. The dielectric layer 420 formed between electrode fingers 310 may provide an interlayer capacitance $C_i$ 425, as described with reference to FIG. 3A. A capacitance of interlayer capacitance $C_i$ 425 may be based on a width of the spacing between the first electrode finger 410-a and the second electrode finger 410-b, as well as the material of the dielectric layer 420.

Referring to a cross-section view of FMOM capacitor 400-b of FIG. 4B, the FMOM capacitor 400-b may have an increased capacitance density compared to existing FMOM capacitors, without increasing a footprint of the FMOM capacitor 400-b. The FMOM capacitor 400-b may have various features, for example, including a plurality of electrode fingers 410, a dielectric layer 435 formed on sidewalls of the electrode fingers 410, and a negative capacitance material 440 formed within a channel defined between sidewalls of a set of electrode fingers 410. The dielectric layer 435 (e.g., dielectric layer 435-a and 435-b) formed between electrode fingers 410 (e.g., electrode fingers 410-a and 410-b), and the negative capacitance material 440 formed within a channel defined between sidewalls of the dielectric layer 435 may provide a new interlayer capacitance $C_{new}$, as described with reference to FIG. 3B.

FIGS. 5A through 5D show an example of a method or methods that support an FMOM capacitor 500 containing negative capacitance material in accordance with aspects of the present disclosure. In some examples, the FMOM capacitor 500 may implement aspects the FMOM capacitor structures as described with reference to FIGS. 1 through 4. In the following description of the method or methods that support the FMOM capacitor 500, the operations may be performed in a different order than the exemplary order shown, or at different times. Certain operations may also be left out of the method or methods, or other operations may be added to the method or methods.

Figure 5A:
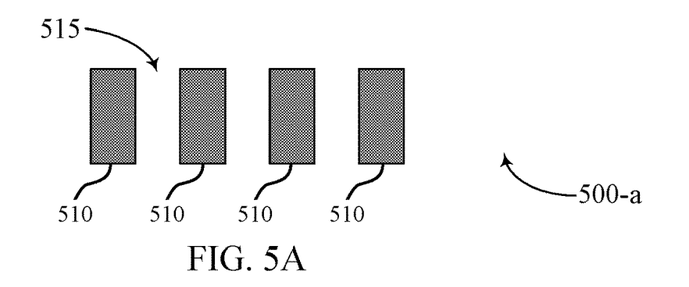
FIGS. 5A through 5D illustrate examples of a method or methods that support an FMOM capacitor containing negative capacitance material in accordance with aspects of the present disclosure.

Referring to intermediate FMOM capacitor 500-a of FIG. 5A, the method of fabricating the FMOM capacitor 500 containing negative capacitance material may include depositing a layer of electrode material 510 and patterning the electrode material 510. The patterned electrode material 510 may be referred to as "fingers". In some embodiments, the layer of electrode material 510 may be deposited on a substrate. The substrate may be made of a material such as silicon, germanium, silicon-germanium alloy, gallium arsenide, gallium nitride, etc. The layer of electrode material 510 may be formed of conductive material, for example, W, Al, Cu, Ti, Co, $CoSi_2$, Ni, NiSi, TiN, TiW, Ta, or TaN, and the like.

As used herein, "patterning" may refer to a process where a structure to be defined, such as the layer of electrode material described above, is formed by removing materials or layers to define that structure. For example, the patterning process may include lithography patterning by providing etch mask structures (e.g., photoresist pattern or a hard mask pattern) over areas to be patterned, followed by etching, such that materials or layers in areas masked by the mask structures are protected while materials or layers in exposed areas are removed by the etch removal. As such, patterning the electrode material 510 may create a spacer extending in a lateral direction along a sidewall of each electrode material 510. The spacer may also define channels 515 between the patterned layer of electrode material 510.

Figure 5B:
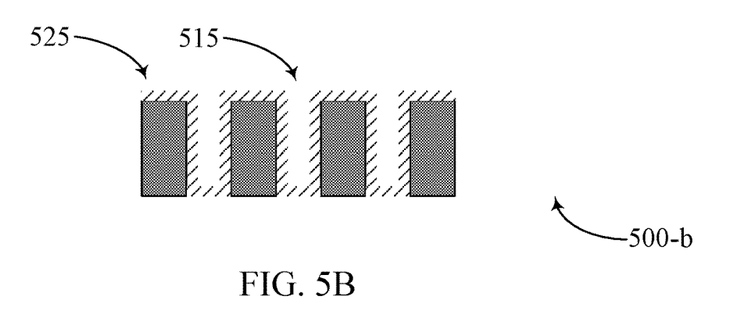

Referring to intermediate FMOM capacitor 500-b of FIG. 5B, the method of fabricating the FMOM capacitor 500 containing negative capacitance material may include depositing a conformal layer of dielectric material 525. In some examples, a thickness of the conformal layer of the dielectric material 525 may be controlled by the conformal deposition of the dielectric material 525. The conformal layer of dielectric material 525 may be deposited by various deposition processes, including vapor deposition processes, such as chemical vapor deposition (CVD) and atomic layer deposition (ALD). In some embodiments, the conformal layer of the dielectric material 525 may be deposited on an upper surface of each electrode 510 and within the channels 515. The conformal layer of dielectric material 525 may additionally, or alternatively coat sidewalls of each of the electrodes 510. For example, the conformal layer of dielectric material 525 may coat a first sidewall of a first electrode 510 and a second sidewall of a second electrode 510. In some embodiments, a portion of the sidewalls of the electrodes 510 may be substantially parallel to a portion of another (e.g., neighboring) electrode 510.

Figure 5C:
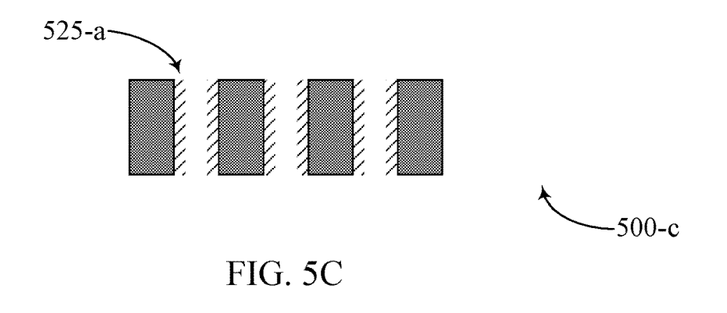

Referring to intermediate FMOM capacitor 500-c of FIG. 5C, the method of fabricating the FMOM capacitor 500 containing negative capacitance material may include performing an etch to the layer of dielectric material 525 deposited on the electrodes 510. In some embodiments, the layer of dielectric material 525 may be etched using a reactive-ion etching (RIE) process. In other embodiments, the layer of dielectric material 525 may be etched using a directional etch, thereby removing horizontally or vertically extending portions of the layer of dielectric material 525. For example, a dry anisotropic etch may be performed to the layer of dielectric material 525 deposited on an upper surface of each electrode 510 and within the channel 515. As a result, the layer of dielectric material 525 is removed from upper surface of each electrode 510 and a lower surface of the channel 515.

A thickness of the channels 515 may be based on a thickness of the layer of dielectric material 525 still present on sidewalls of the electrodes 510. For example, a width of the channels 515 may be inversely proportional to a width of the layer of dielectric material 525 formed on sidewalls of the electrodes 510. In some examples, a length of the channels 515 may be proportional to a length of the electrodes 510, or a length of layer of dielectric material 525 deposited on the sidewalls on the electrodes 510, or a combination thereof.

Figure 5D:
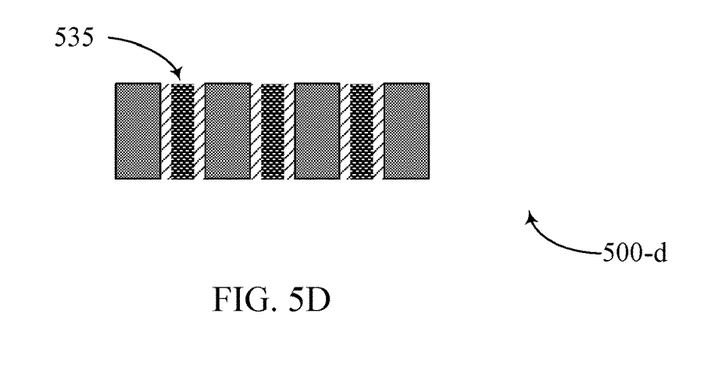

Referring to intermediate FMOM capacitor 500-d of FIG. 5D, the method of fabricating the FMOM capacitor 500 containing negative capacitance material may include depositing a layer of negative capacitance material 535 within the channels 515. The layer of negative capacitance material 535 may be deposited by various deposition processes, including vapor deposition processes, such as CVD and ALD. In some examples, a layer of negative capacitance material 535 may be deposited within at least one of the channels 515. The layer of negative capacitance material 535 may be formed of a material such as $Pb(Zr_{0.2}Ti_{0.8})O_3$, $Hf_{0.42}Zr_{0.58}O_2$, or $Al_{0.83}In_{0.17}N$. In some embodiments, the negative capacitance material 535 may be at least partially overlapping with one or more electrodes 510 in at least one dimension. For example, the negative capacitance material 535 may overlap an electrode 510 in a vertical direction or a horizontal direction.

In some embodiments, the method of fabricating the FMOM capacitor 500 containing negative capacitance material may include planarizing the layer of negative capacitance material 535 within the channel 515, or the layer of dielectric material 525, or the electrodes 510, or a combination thereof. In some examples, planarization may include removing material forming peaks on an upper surface of the partially fabricated integrated circuit, e.g., by performing a CMP process to remove any excess negative capacitance material 535 on the upper surface. The CMP process may be performed after depositing the layer of negative capacitance material 535 within the channel 515.

In some embodiments, a thickness (e.g., width) of the layer of negative capacitance material 535 deposited within the channels 515 may be based on a thickness (e.g., width) of the channels 515, which may be dependent on a thickness of the a thickness of the layer of dielectric material 525 still present on sidewalls of the electrodes 510. As a result, the thickness $S_1$ and $S_2$ ratio, as described with reference to FIGS. 3 and 4, can be controlled using the method described herein.

The method of fabricating the FMOM capacitor 500 uses a self-aligned method to insert the negative capacitance material into minimum spacing (e.g., channel 515), and overcoming conventional lithography resolution issues. Thereby, by inserting negative capacitance material into a channel (i.e., the FMOM intralayer dielectric), the FMOM capacitor 500 may overcome the dielectric constant restriction of conventional dielectric material, as well as increase the capacitance density of the FMOM capacitor 500.

Figure 6:
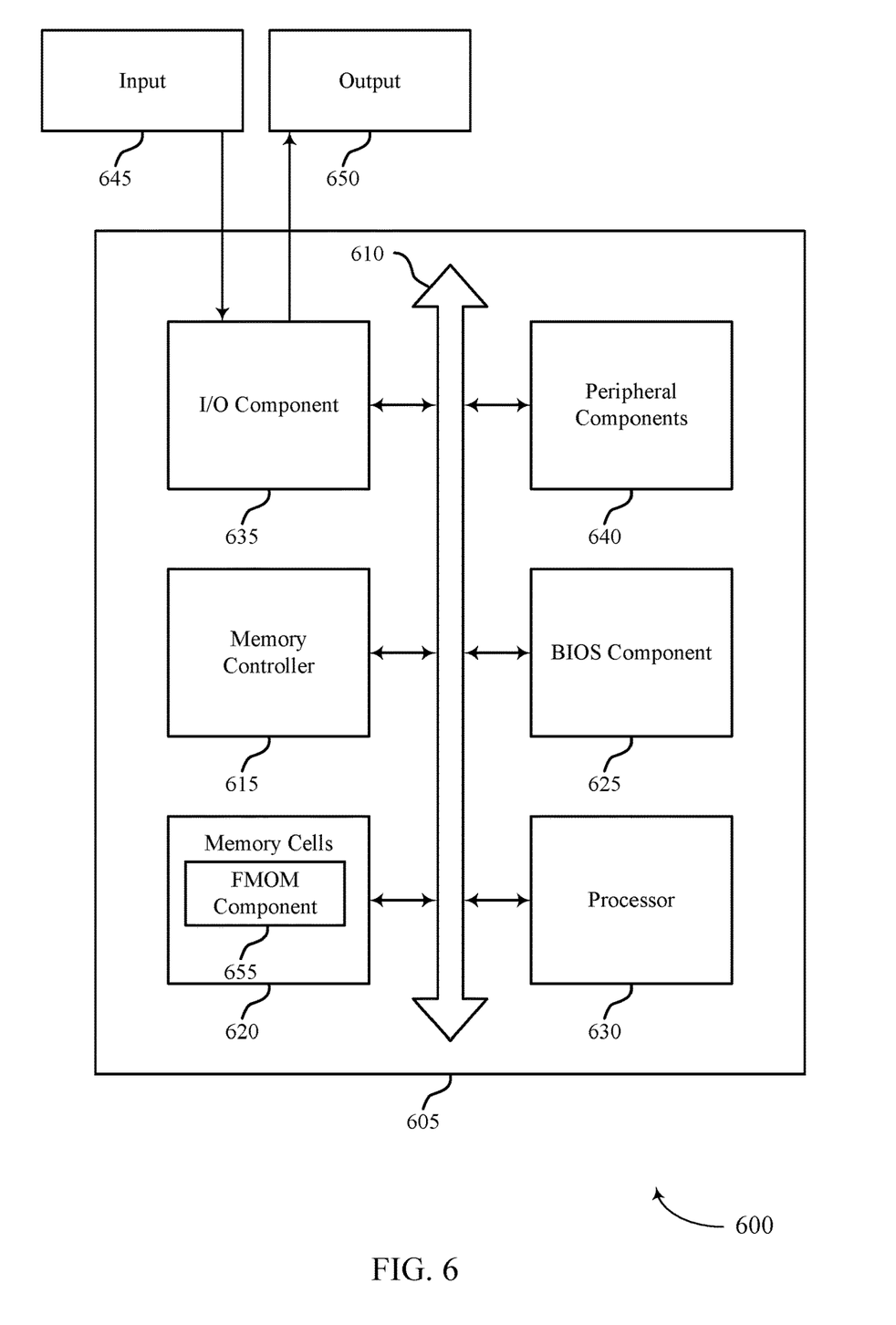
FIG. 6 illustrates a block diagram of a system including a device that supports an FMOM capacitor containing negative capacitance material in accordance with aspects of the present disclosure.

FIG. 6 shows a block diagram of a system 600 including a device 605 that supports an FMOM capacitor containing a negative capacitance material in accordance with aspects of the present disclosure. The device 605 including one or more FMOM capacitor containing a negative capacitance material may be used for processors, memory, or power management applications, and the like. The device 605 may be an example of or include the components of an FMOM capacitor as described above, for example, with reference to FIG. 1. The device 605 may include components for bi-directional communications including components for transmitting and receiving communications, including a memory controller 615, memory cells 620, a basic input/output system (BIOS) component 625, a processor 630, an I/O component 635, and peripheral components 640. These components may be in electronic communication via one or more busses (e.g., bus 610).

The memory controller 615 may operate one or more memory cells 620. Specifically, the memory controller 615 may be configured to support accessing memory cells 620 (e.g., reading or writing to a memory cell). In some cases, the memory controller 615 may include a row decoder, column decoder, or both for accessing memory cells 620.

The memory cells 620 may be configured with an FMOM capacitor component 655 as described herein, and may store information (e.g., in the form of a logic state) as described herein. Each memory cell 620 may have at least one FMOM capacitor to store information.

In some examples, the memory cells 620 may define a random access memory (RAM) or read only memory (ROM). The memory cells 620 may, additionally or alternatively, define a dynamic RAM (DRAM), synchronous dynamic RAM (SDRAM), ferroelectric RAM (FeRAM), magnetic RAM (MRAM), resistive RAM (RRAM), flash memory, phase change memory (PCM), or any other medium that can be used to store desired program code in the form of instructions or data structures and that can be accessed by a computer or a processor. The memory cells 620 may store computer-readable, computer-executable software including instructions that, when executed, cause the processor to perform various functions described herein.

The BIOS component 625 be a software component that includes BIOS operated as firmware, which may initialize and run various hardware components. The BIOS component 625 may also manage data flow between a processor and various other components, such as peripheral components, I/O control components, and others. The BIOS component 625 may include a program or software stored in read only memory (ROM), flash memory, or any other non-volatile memory.

The processor 630 may include an intelligent hardware device, (e.g., a general-purpose processor, a digital signal processor (DSP), an image signal processor (ISP), a central processing unit (CPU), a graphics processing unit (GPU), a microcontroller, an application-specific integrated circuit (ASIC), a field-programmable gate array (FPGA), a programmable logic device, a discrete gate or transistor logic component, a discrete hardware component, or any combination thereof). In other cases, a memory controller may be integrated into processor 630. Processor 630 may be configured to execute computer-readable instructions stored in a memory to perform various functions (e.g., functions or tasks supporting dual phase detection auto focus power optimization).

The I/O component 635 may manage input and output signals for the device 605. The I/O component 635 may also manage peripherals not integrated into the device 605. In some cases, the I/O component 635 may represent a physical connection or port to an external peripheral. In some cases, the I/O component 635 may utilize an operating system such as iOS®, ANDROID®, MS-DOS®, MS-WINDOWS®, OS/2®, UNIX®, LINUX®, or another known operating system. In other cases, the I/O component 635 may represent or interact with a modem, a keyboard, a mouse, a touchscreen, or a similar device. In some cases, the I/O component 635 may be implemented as part of a processor. In some cases, a user may interact with the device 605 via the I/O component 635 or via hardware components controlled by the I/O component 635. The I/O component 635 may support accessing the memory cells 620, including receiving information associated with the sensed logic state of one or more of the memory cells 620, or providing information associated with writing a logic state of one or more of the memory cells 620.

The peripheral components 640 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 645 may represent a device or signal external to the device 805 that provides input to the device 605 or its components. This may include a user interface or an interface with or between other devices. In some cases, the input 645 may be managed by the I/O component 635, and may interact with the device 605 via a peripheral component 640.

The output 650 may represent a device or signal external to the device 605 configured to receive output from the device 605 or any of its components. Examples of the output 650 may include a display, audio speakers, a printing device, another processor or printed circuit board, or other devices. In some cases, the output 650 may be a peripheral element that interfaces with the device 605 via the peripheral component(s) 640. In some cases, the output 650 may be managed by the I/O component 635.

As detailed above, system 600 and/or one or more components of the system 600 may perform and/or be a means for performing, either alone or in combination with other elements, one or more operations for fabricating an FMOM capacitor containing a negative capacitance material.

Figure 7:
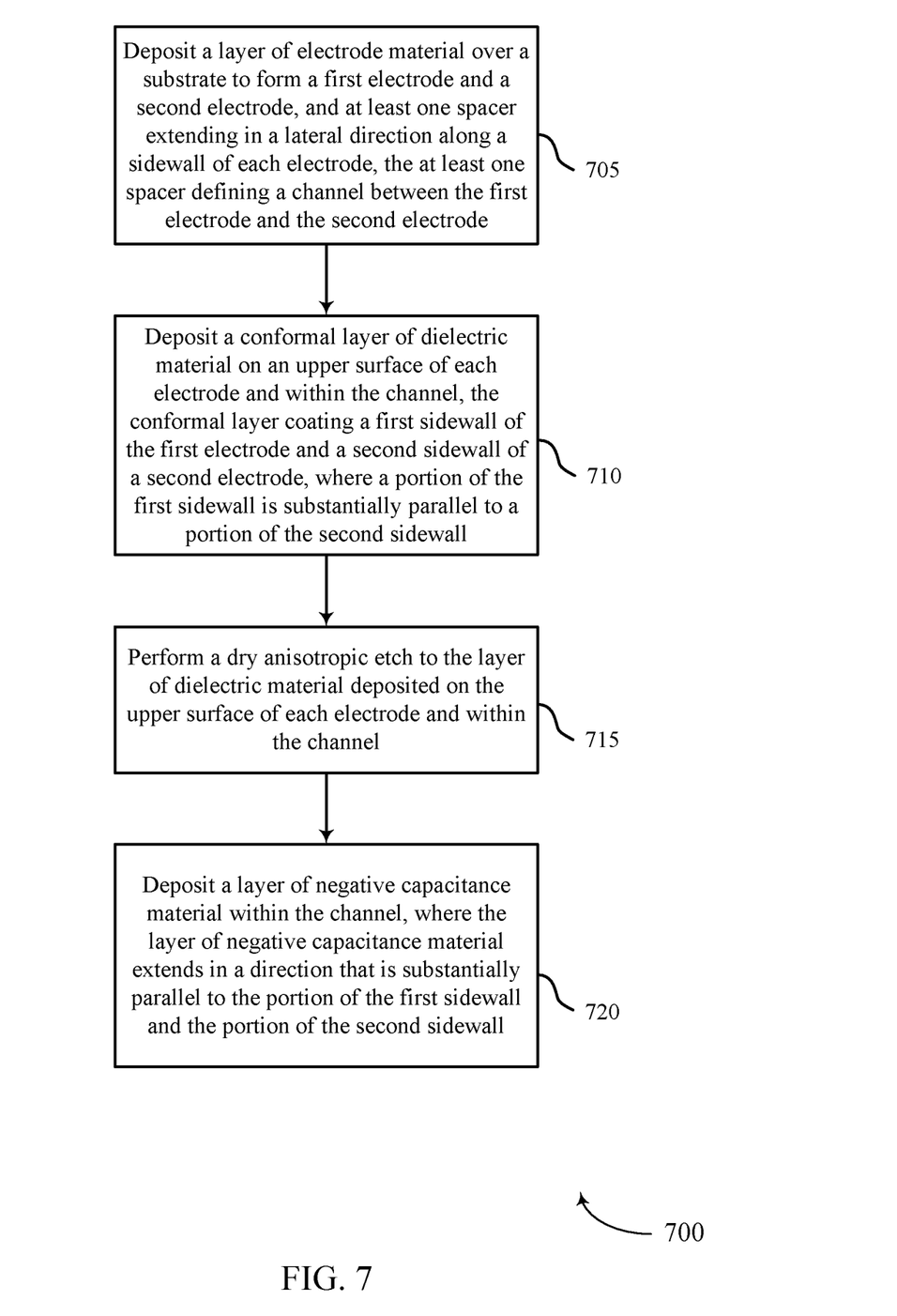
FIGS. 7 and 8 illustrate methods for fabricating an FMOM capacitor containing negative capacitance material in accordance with aspects of the present disclosure.

FIG. 7 shows a flowchart illustrating a method 700 for fabricating an FMOM capacitor containing negative capacitance material in accordance with aspects of the present disclosure. The operations of method 700 may be implemented by a device or integrated circuit, or their components as described herein. For example, operations of method 800 may be performed at least in part by an FMOM component 655 as described with reference to FIG. 6. In some examples, the FMOM component 655 may execute a set of instructions to control the functional elements of the FMOM component 655 to perform the functions described below. Additionally or alternatively, the FMOM component 655 may perform some or all of the functions described below using special-purpose hardware.

In the following description of the method 700, the operations may be performed in a different order than the exemplary order shown, or at different times. Certain operations may also be left out of the method 700, or other operations may be added to the method 700.

At 705 the FMOM component 655 may deposit a layer of electrode material over a substrate to form a first electrode and a second electrode, and at least one spacer extending in a lateral direction along a sidewall of each electrode, that at least one spacer defining a channel between the first electrode and the second electrode. The operations of 705 may be performed according to the methods described herein.

At 710 the FMOM component 655 may deposit a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall. The operations of 710 may be performed according to the methods described herein.

At 715 the FMOM component 655 may perform a dry anisotropic etch to the layer of dielectric material deposited on the upper surface of each electrode and within the channel. The operations of 715 may be performed according to the methods described herein.

At 720 the FMOM component 655 may deposit a layer of negative capacitance material within the channel, where the layer of negative capacitance material extends in a direction that is substantially parallel to the portion of the first sidewall and the portion of the second sidewall. The operations of 720 may be performed according to the methods described herein.

Figure 8:
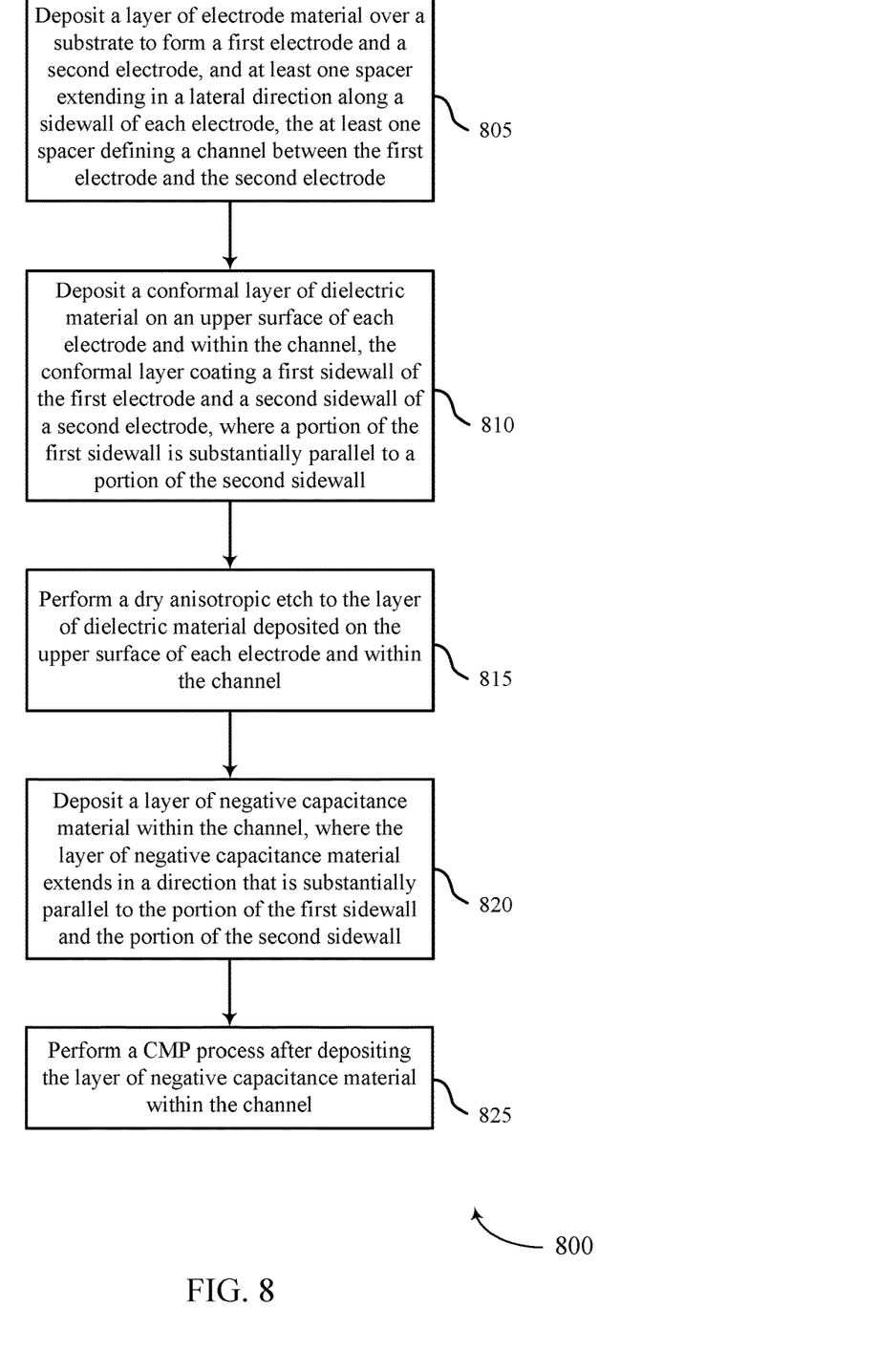

FIG. 8 shows a flowchart illustrating a method 800 for fabricating an FMOM capacitor containing negative capacitance material in accordance with aspects of the present disclosure. The operations of method 800 may be implemented by a device or integrated circuit, or their components as described herein. For example, operations of method 800 may be performed at least in part by an FMOM component 655 as described with reference to FIG. 6. In some examples, the FMOM component 655 may execute a set of instructions to control the functional elements of the FMOM component 655 to perform the functions described below. Additionally or alternatively, the FMOM component 655 may perform some or all of the functions described below using special-purpose hardware.

In the following description of the method 800, the operations may be performed in a different order than the exemplary order shown, or at different times. Certain operations may also be left out of the method 800, or other operations may be added to the method 800.

At 805 the FMOM component 655 may deposit a layer of electrode material over a substrate to form a first electrode and a second electrode, and at least one spacer extending in a lateral direction along a sidewall of each electrode, that at least one spacer defining a channel between the first electrode and the second electrode. The operations of 805 may be performed according to the methods described herein.

At 810 the FMOM component 655 may deposit a conformal layer of dielectric material on an upper surface of each electrode and within the channel, the conformal layer coating a first sidewall of the first electrode and a second sidewall of a second electrode, where a portion of the first sidewall is substantially parallel to a portion of the second sidewall. The operations of 810 may be performed according to the methods described herein.

At 815 the FMOM component 655 may perform a dry anisotropic etch to the layer of dielectric material deposited on the upper surface of each electrode and within the channel. The operations of 815 may be performed according to the methods described herein.

At 820 the FMOM component 655 may deposit a layer of negative capacitance material within the channel, where the layer of negative capacitance material extends in a direction that is substantially parallel to the portion of the first sidewall and the portion of the second sidewall. The operations of 820 may be performed according to the methods described herein.

At 825 the FMOM component 655 may perform a CMP process after depositing the layer of negative capacitance material within the channel. The operations of 825 may be performed according to the methods described herein.

It should be noted that the methods described above describe possible implementations, and that the operations and the steps may be rearranged or otherwise modified and that other implementations are possible. Further, aspects from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

As used herein, the term "electrode" may refer to an electrical conductor, and in some cases, may be employed as an electrical contact to an FMOM capacitor or other component of a memory array. An electrode may include a trace, wire, conductive line, conductive layer, or the like that provides a conductive path between elements or components of FMOM capacitor 100.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, such as a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

The devices discussed herein, including an FMOM capacitor, described with reference to FIGS. 1 through 5, may be formed on a semiconductor substrate, such as silicon, germanium, silicon-germanium alloy, gallium arsenide, gallium nitride, etc. In some cases, the substrate is a semiconductor wafer. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A finger metal-on-metal (FMOM) capacitor, comprising:
    at least one layer comprising a first electrode and a second electrode;
    a dielectric layer disposed in a channel extending between a first sidewall of the first electrode and a second sidewall of the second electrode of the at least one layer, wherein a first portion of the dielectric layer coats the first sidewall of the first electrode and a second portion of the dielectric layer coats the second sidewall of the second electrode, wherein a portion of the first sidewall is substantially parallel to a portion of the second sidewall; and
    a negative capacitance material disposed in the channel between the first sidewall of the first electrode and the second sidewall of the second electrode, wherein the negative capacitance material contacts the first portion of the dielectric layer coating the first sidewall and the second portion of the dielectric layer coating the second sidewall, and extends in a direction that is substantially parallel to the portion of the first sidewall and the portion of the second sidewall.

2. The FMOM capacitor of claim 1, wherein the negative capacitance material, the first electrode, and the second electrode are coplanar.

3. The FMOM capacitor of claim 1, wherein the negative capacitance material disposed in the channel is positioned within a footprint of the FMOM capacitor.

4. The FMOM capacitor of claim 1, wherein the negative capacitance material is at least partially overlapping with the first electrode or the second electrode, or both in at least one dimension.

5. The FMOM capacitor of claim 1, wherein the first electrode and the second electrode are a positive electrode or a negative electrode.

6. The FMOM capacitor of claim 1, wherein the negative capacitance material comprises a material chosen from the group consisting of $Pb(Zr_{0.2}Ti_{0.8})O_3$, $Hf_{0.42}Zr_{0.58}O_2$, and $Al_{0.83}In_{0.17}N$.

7. The FMOM capacitor of claim 1, wherein a width of the channel is inversely proportional to a width of the dielectric layer formed on sidewalls of the first electrode and the second electrode.

8. The FMOM capacitor of claim 1, wherein a length of the channel is proportional to a length of the first electrode and the second electrode, or a length of the dielectric layer formed on sidewalls of the first electrode or the second electrode, or a combination thereof.

9. An integrated circuit, comprising:
    a first layer comprising a plurality of electrodes;
    a dielectric layer deposited in a channel between at least one set of electrodes of the first layer and formed on sidewalls of the plurality of electrodes of the first layer, the channel extending between a sidewall of a first electrode and a sidewall of a second electrode of the at least one set of electrodes;
    a negative capacitance material deposited in the channel;
    a second dielectric layer formed across an upper surface of the plurality of electrodes, an upper surface of the dielectric layer, and an upper surface of the negative capacitance material;
    a second layer comprising a plurality of electrodes formed on the second dielectric layer;
    a third dielectric layer deposited in a channel between at least one set of electrodes of the plurality of electrodes of the second layer and formed on sidewalls of the plurality of electrodes of the second layer, the channel extending between a sidewall of a third electrode and a sidewall of a fourth electrode of the at least one set of electrodes of the plurality of electrodes of the second layer; and
    a second negative capacitance material deposited in the channel between the at least one set of electrodes of the plurality of electrodes of the second layer.

10. The integrated circuit of claim 9, wherein:
    the sidewall of the first electrode and the sidewall of the second electrode associated with the first layer have the dielectric layer formed thereon; and
    the sidewall of the third electrode and the sidewall of the fourth electrode associated with the second layer have the third dielectric layer formed thereon.

11. The integrated circuit of claim 9, wherein the negative capacitance material or the second negative capacitance material, or both comprises a material chosen from the group consisting of $Pb(Zr_{0.2}Ti_{0.8})O_3$, $Hf_{0.42}Zr_{0.58}O_2$, and $Al_{0.83}In_{0.17}N$.

12. The integrated circuit of claim 9, wherein the first layer is in electronic communication with the second layer through at least one interconnect.

13. The integrated circuit of claim 9, wherein the first electrode of the first layer, and the second electrode of the first layer, and the negative capacitance material deposited in the channel between the at least one set of electrodes of the first layer, are coplanar.

14. The integrated circuit of claim 9, wherein the third electrode of the second layer, and the fourth electrode of the second layer, and the second negative capacitance material deposited in the channel between the at least one set of electrodes of the second layer, are coplanar.

* * * * *